United States Patent
Brady et al.

[11] Patent Number: 6,034,399
[45] Date of Patent: Mar. 7, 2000

[54] ELECTROSTATIC DISCHARGE PROTECTION FOR SILICON-ON-INSULATOR

[75] Inventors: Frederick T. Brady, Chantilly; Robert C. Bertin, Fairfax, both of Va.

[73] Assignee: Lockheed Martin Corporation, Bethesda, Md.

[21] Appl. No.: 08/812,183

[22] Filed: Mar. 6, 1997

[51] Int. Cl.⁷ .......................... H01L 23/62; H01L 27/01; H01L 27/12; H01L 29/00
[52] U.S. Cl. .......................... 257/355; 257/347; 257/350; 257/546
[58] Field of Search .................. 257/355, 546, 257/350, 347

[56] References Cited

U.S. PATENT DOCUMENTS

| | | | |
|---|---|---|---|
| 4,989,057 | 1/1991 | Lu ........................................... | 257/347 |
| 5,081,514 | 1/1992 | Ueoka ..................................... | 257/355 |
| 5,113,236 | 5/1992 | Arnold et al. ........................... | 257/347 |
| 5,116,768 | 5/1992 | Kawamura ............................... | 437/21 |
| 5,139,959 | 8/1992 | Craft et al. .............................. | 257/355 |
| 5,185,535 | 2/1993 | Farb et al. ............................... | 257/351 |
| 5,204,988 | 4/1993 | Sakurai .................................... | 257/356 |
| 5,225,702 | 7/1993 | Chatterjee ............................... | 257/355 |
| 5,430,595 | 7/1995 | Wagner et al. .......................... | 257/355 |
| 5,489,792 | 2/1996 | Hu et al. ................................. | 257/347 |
| 5,517,051 | 5/1996 | Chatterjee ............................... | 257/355 |
| 5,534,722 | 7/1996 | Takasu et al. ........................... | 257/355 |
| 5,610,790 | 3/1997 | Staab et al. .............................. | 361/56 |
| 5,751,041 | 5/1998 | Suzuki et al. ........................... | 257/355 |

OTHER PUBLICATIONS

IBM Technical Disclosure Bulletin, vol. 16, No. 3, pp. 1027–1029, Aug. 1973.

*Primary Examiner*—Steven H. Loke
*Attorney, Agent, or Firm*—Lane, Aitken and McCann

[57] ABSTRACT

An ESD protection arrangement for a silicon-on-insulator device has an N-well type implant in the silicon substrate of the device, a $p^+$ implant forming a juncture with the N-well type implant, and an $n^+$ implant defining a juncture with the N-well type implant, in order to protect against negative transients and positive transients. At the p-channel threshold adjust, both the p-channel of the device and the N-well are implanted. Implanting the N-well to a depth of about 0.15 to about 0.30 $\mu$m provides suitable characteristics for both the N-well and the p-channel.

18 Claims, 7 Drawing Sheets ic 6,034,399

ELECTROSTATIC DISCHARGE PROTECTION FOR SILICON-ON-INSULATOR

BACKGROUND OF THE INVENTION

A major problem experienced by semiconductor chips when handled by humans, such as during packaging or testing, is damage by electrostatic discharge. Charge builds up on people and on tools used by people. When people or charged objects contact a chip, the charge is released with a large voltage surge. This voltage surge can easily damage unprotected chip inputs. Similarly, a very large scale integrated circuit (VLSI) chip in an electronic system is susceptible to voltage and current surges that occur in the system.

In conventional circuits built in bulk silicon, protection circuits typically consist of large area diodes to ground and power. In silicon-on-insulator (SOI) technology, however, devices are built in a very thin silicon film that, in turn, is positioned on an insulating layer. As a result, junctions are lateral, rather than vertical. Thus, a large area diode would require an enormous amount of chip area.

It has previously been proposed for SOI that MOS transistors built in the silicon film be used as protect devices. However, MOS transistors are not as reliable nor as good a protection scheme as are diodes. Furthermore, current conduction is still limited in a very thin silicon film. In electrostatic discharge (ESD) events, large currents flow. Thus, in order to meet the thermal requirements expected for an ESD current in such films, the protect circuits must still be quite large.

It has also been proposed that a vertical protect diode could be formed for SOI technology by etching a contact through the buried oxide and forming a diode with the substrate. However, although this technique is quite useful for making a rectifying contact with the substrate, it primarily protects against negative transients. Positive transients must also be protected against.

SUMMARY OF THE INVENTION

By the present invention, bulk silicon protect circuits are simulated in SOI. This is done by etching away the buried oxide in areas near each input pad so that the protect circuit is built in an area like bulk silicon. As a result, vertical junctions are achieved, and the heat from the ESD current is dissipated into the silicon substrate. Furthermore, an arrangement is provided for protecting against negative transients and positive transients Moreover, no redesign is required of the bulk ESD circuit, the same mask set can be used, and there is no area penalty compared to the large structures associated with typical SOI protect circuits.

The oxide removal etch step is done before forming the lateral isolation, so that the lateral isolation can be formed in the required areas in the protect circuit. Another step is the simulation of an N-well implant. The procedure used to form the p-channel threshold voltage implant in the areas of the SOI device to be protected against ESD is used to simultaneously form an implant like an N-well in the ESD area of the device. The dose and energy of these two implants are critical. The parameters must be such that the N-type implant has the correct energy and dose that a low resistance N-type layer is formed immediately below the lateral isolation in the bulk-like ESD protect circuit areas in order to have a low sheet resistance for the high currents experienced during ESD discharge. On the other hand, the procedure used to form both of the implants must not be made to form the N-type implant so shallow that it changes the impurity level in the body of the p-channel devices. Higher impurity levels reduce carrier mobility. Also, having a threshold voltage dependent on two implants increases the variance of the threshold voltage. Thus, it is important for p-channel device performance to have as low a body doping as possible and to not have the N-well like implant affect the impurity concentration in the transistor.

The vertical depth of the lateral isolation is also important. If it is too thin, the implant process window will be too small. If it is too thick, device performance will be reduced. For example, if a local-oxidation-of-silicon (LOCOS) isolation is used, a too-thick lateral isolation results in an encroachment of the isolation into the device, causing a reduction in the device width, with a reduction in device current.

DESCRIPTION OF THE PREFERRED EMBODIMENT

Figure 1:
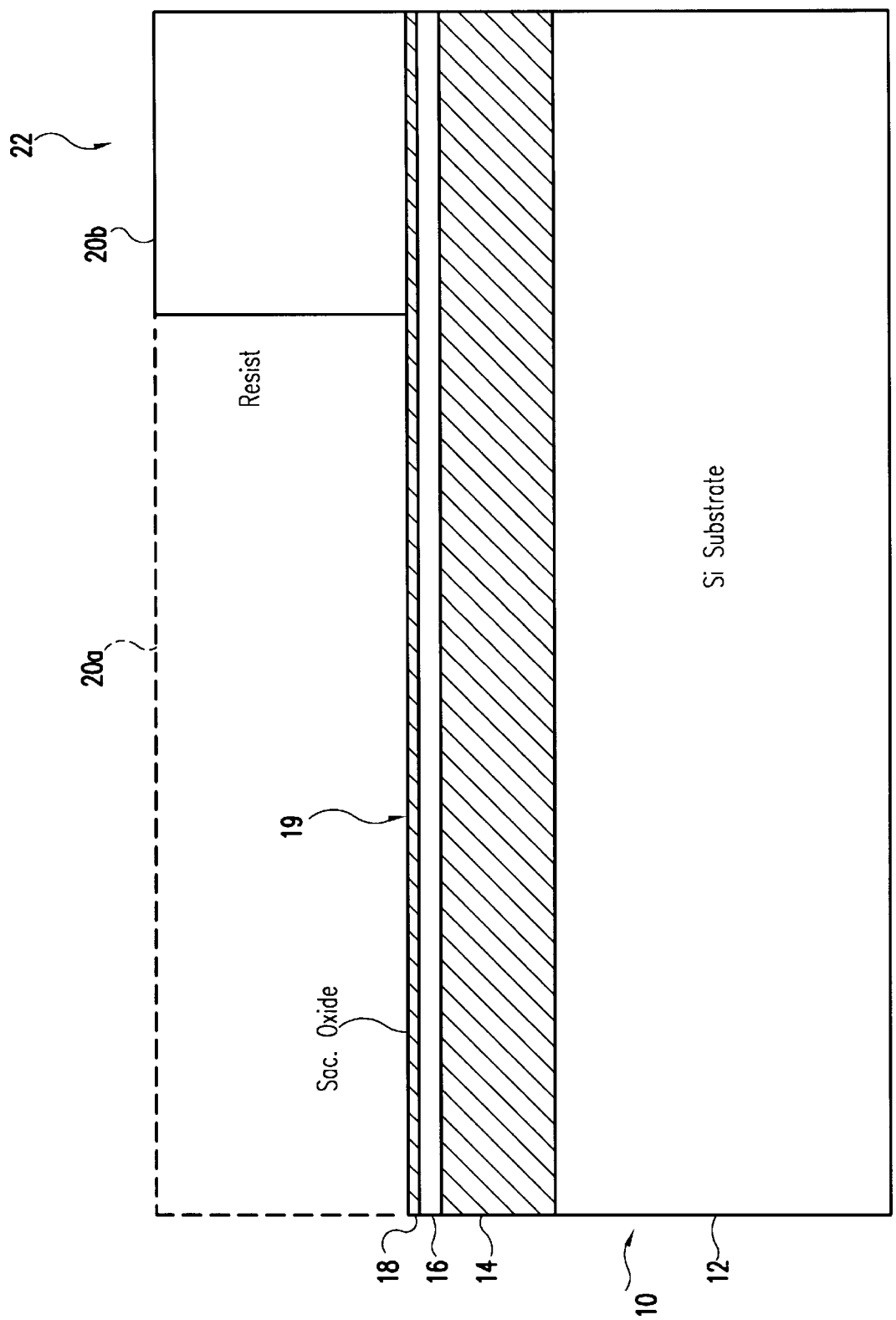
FIG. 1 is a schematic cross section of a portion of an SOI structure in a first stage of processing to produce an ESD protection arrangement according to the present invention.
Figure 2:
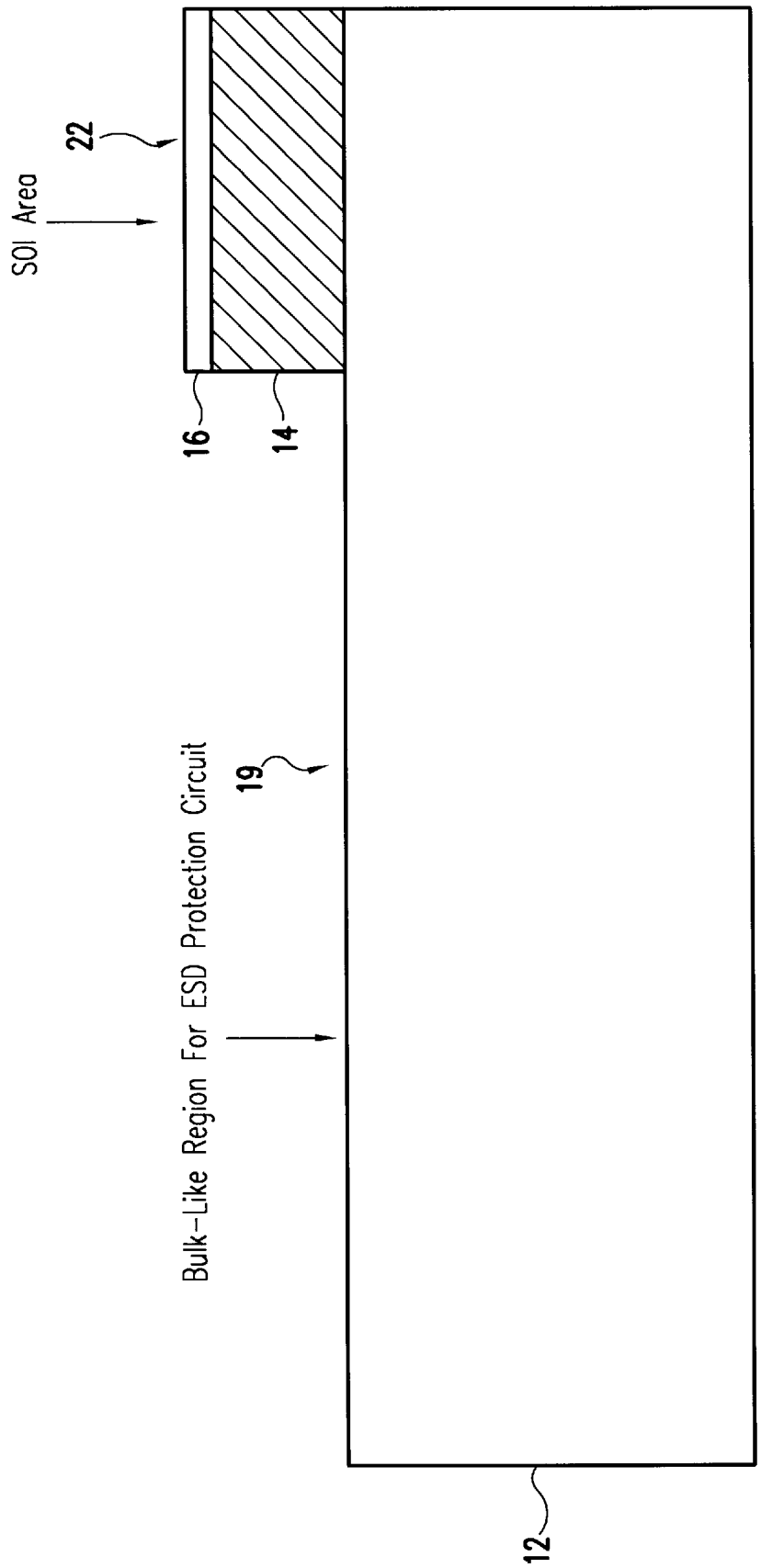
FIG. 2 is a schematic cross section of the SOI structure of FIG. 1 in a second stage of processing.

In a method of making an SOI device having ESD protection according to the present invention, a conventional SOI wafer 10 comprising a silicon substrate 12, a buried oxide 14, which can be an $SiO_2$ layer on the substrate, and a silicon film 16 on the buried oxide is used. As can be seen from FIG. 1, a sacrificial oxide layer 18 is grown, and ESD areas 19 are defined using a photoresist in which a portion 20a is unhardened and a portion 20b is hardened. The sacrificial oxide 18 is used to separate the photoresist 20a and 20b from the silicon film 16 to avoid contamination problems. The unhardened portion 20a of the photoresist, shown in dashed lines, is removed by conventional methods to define the ESD areas 19, in which a back-to-back diode arrangement can be used, while the hardened portion 20b remains to define an SOI area 22. As can be seen from FIG. 2, the sacrificial oxide layer 18, the silicon film 16 and the buried oxide 14 are all etched away in the ESD area 19, while the hardened portion 20b of the photoresist protects all of them in the SOI area 22. The silicon film 16 is etched by conventional means followed by an etching of the buried oxide 18 down to the surface of the silicon substrate 12 by a conventional etching process, such as an RIE etch. The hardened portion 20b and the sacrificial oxide 18 remaining in the SOI area 22 are stripped.

Figure 3:
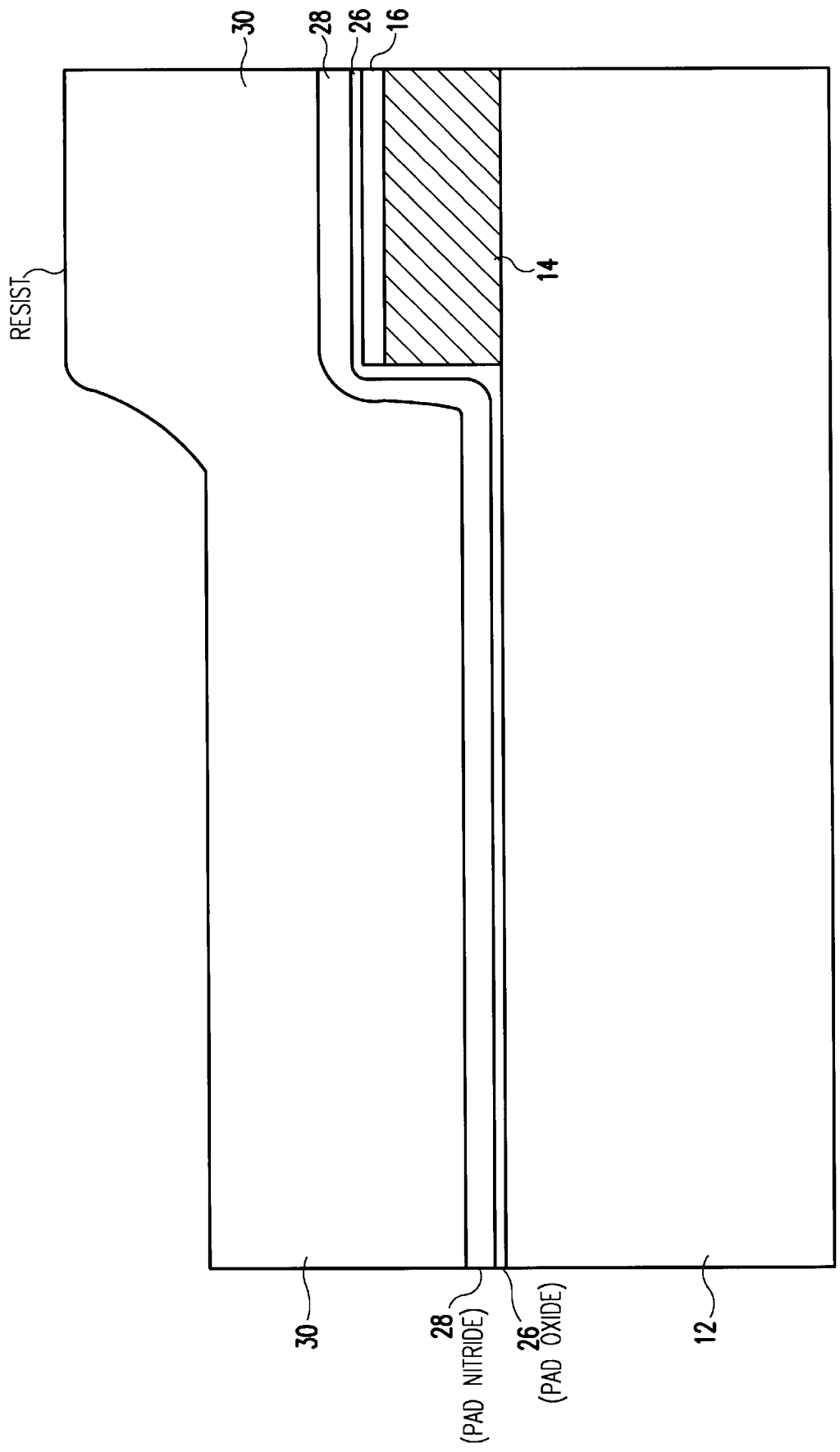
FIG. 3 is a schematic cross section of the SOI structure of FIG. 1 in a third stage of processing.
Figure 4:
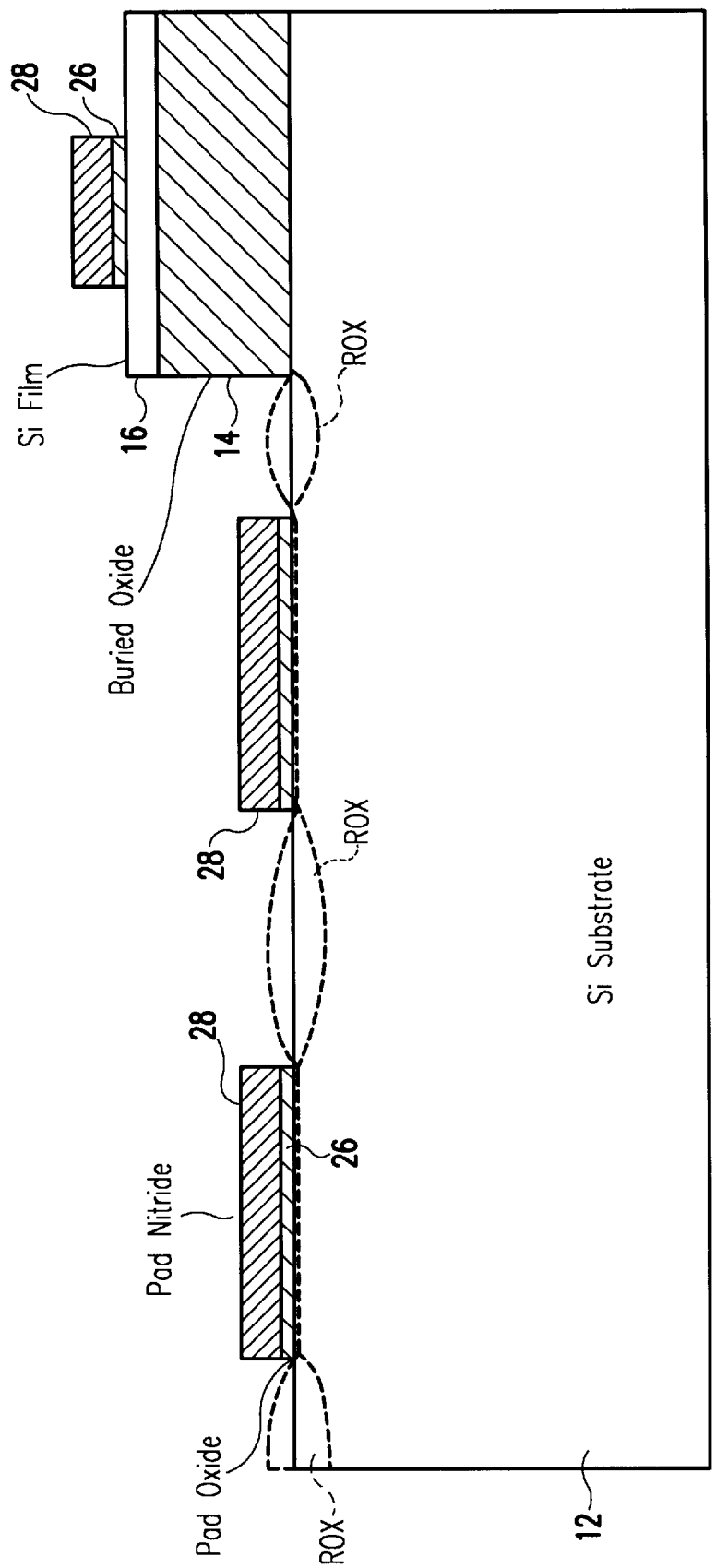
FIG. 4 is a schematic cross section of the SOI structure of FIG. 1 in a fourth stage of processing.
Figure 5:
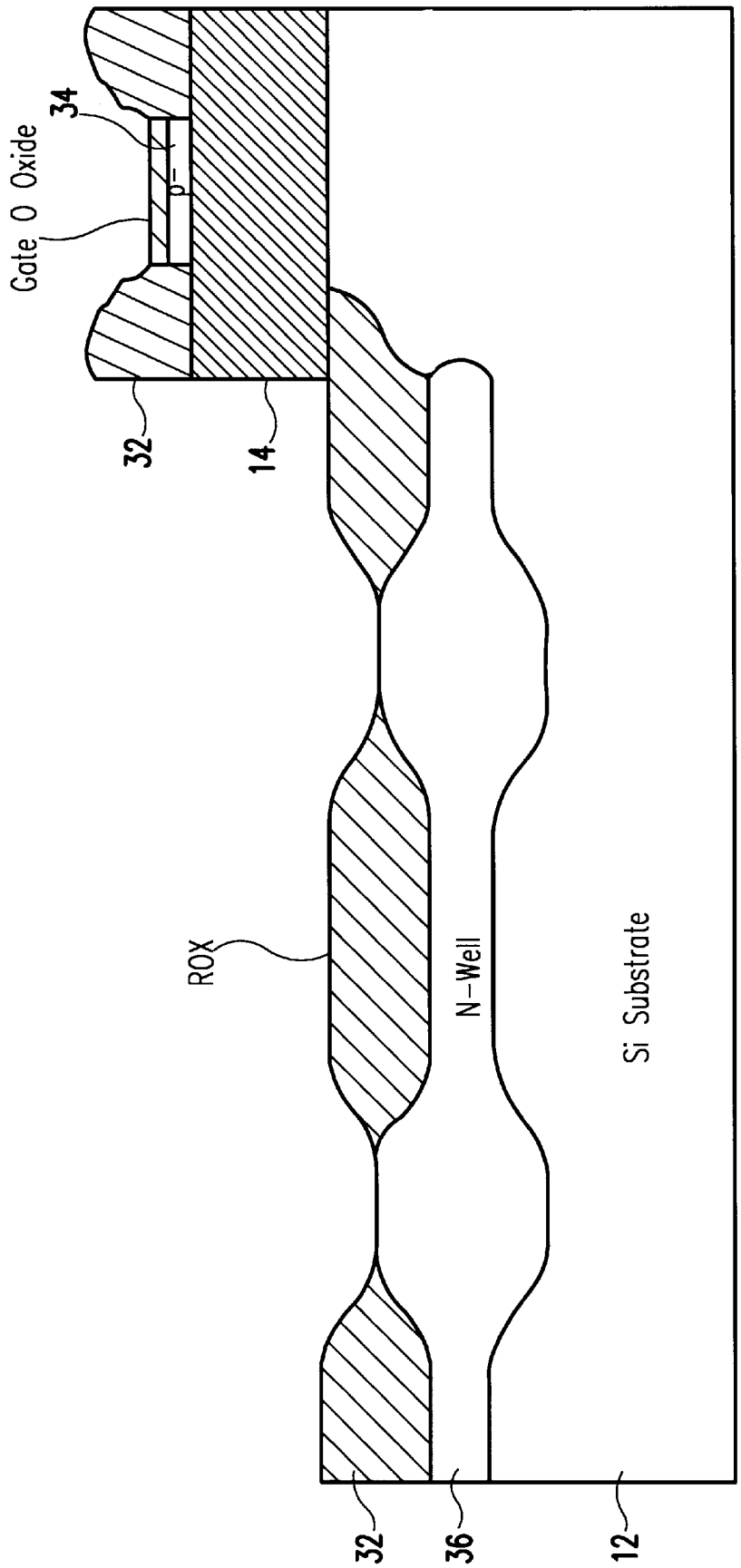
FIG. 5 is a schematic cross section of the SOI structure of FIG. 1 in a fifth stage of processing.

As can be appreciated from FIG. 3, an oxide/nitride pad stack comprising an oxide layer 26 and a nitride layer 28 is deposited, followed by a resist layer 30. Device areas are photodefined, as are areas of the pad stack in which a field oxide is not to be grown. Unhardened portions of the resist 30 are removed, and the pad stack is etched through in both the ESD area 19 and the SOI area 22, leaving the silicon substrate 12 exposed in portions of the ESD area 19. The hardened portions of the resist are stripped to leave the structure shown in solid lines in FIG. 4. As can be appreciated from the dashed lines, an oxide 32 is grown to a thickness of, for example, 2700 Angstroms by, for example, LOCOS in the exposed portions of the silicon substrate 12. As can be seen from FIGS. 4 and 5, the remaining portions of the nitride layer 28 and the oxide layer 26 of the pad are stripped.

Figure 6:
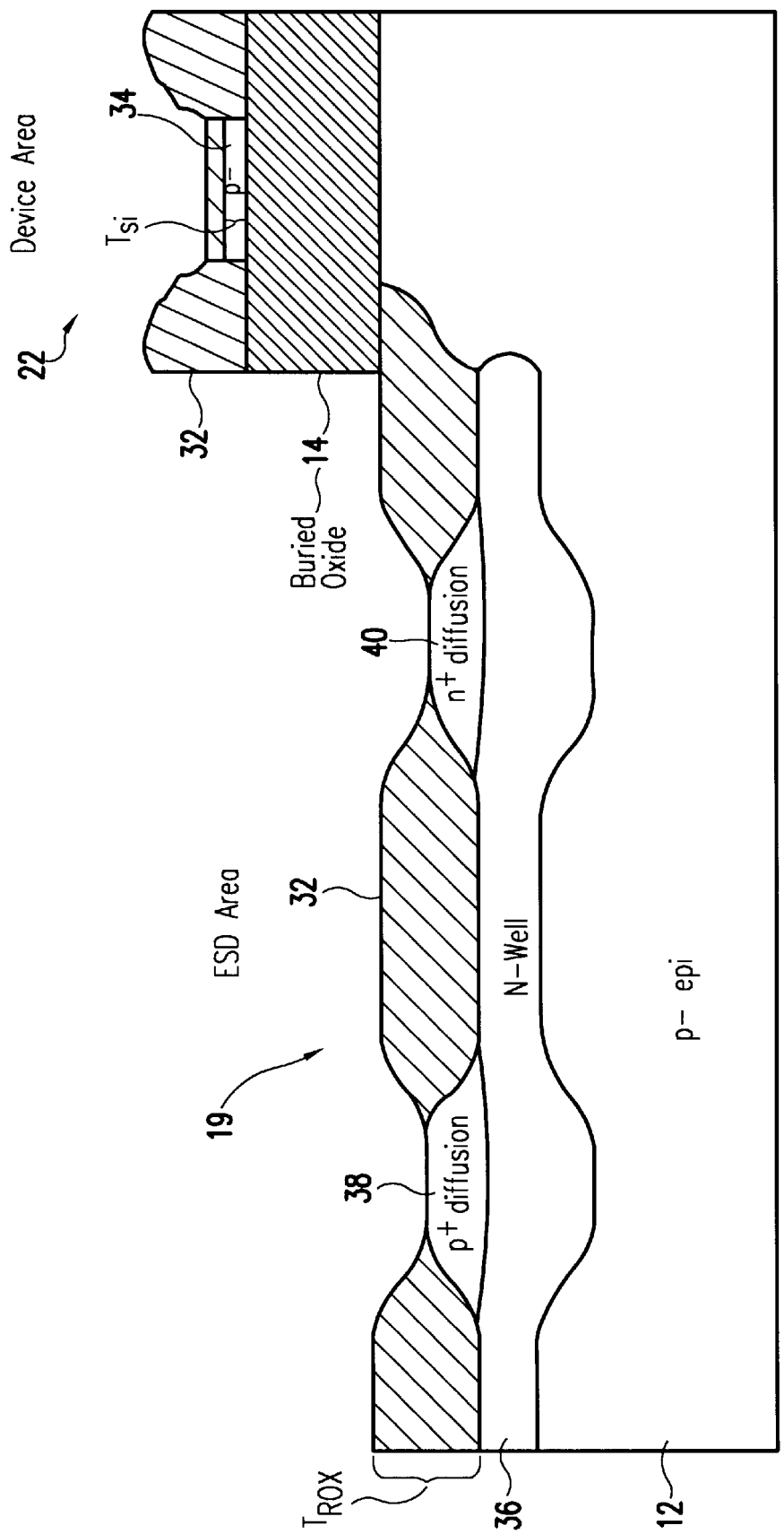
FIG. 6 is a schematic cross section of a portion of an SOI structure having an ESD protection arrangement according to the present invention.

Standard processing is done up to the p-channel threshold adjust. As can be seen from FIG. 5, at the p-channel threshold adjust, the standard adjust implant is done, resulting in a p-channel implant 34 in the SOI area 22, and a phosphorous N-well like implant is done resulting in the implant 36 in the ESD area 19, both at an energy of 260 kV and a dose of 1E12 ions per cm$^2$. As can be seen from FIG. 6, a P$^+$ diffusion implant 38 and an n$^+$ diffusion implant 40 are implanted, each in a conventional manner, each being exposed at an exterior surface in the ESD area 19. The p$^+$ implant 38 and the n$^+$ implant 40 protect against positive and negative transients. In doing the implants 38 and 40, the appropriate ESD protect circuit areas are covered/exposed such that the appropriate contacts are made to the N-well like implant 36 and the substrate 12.

Figure 7:
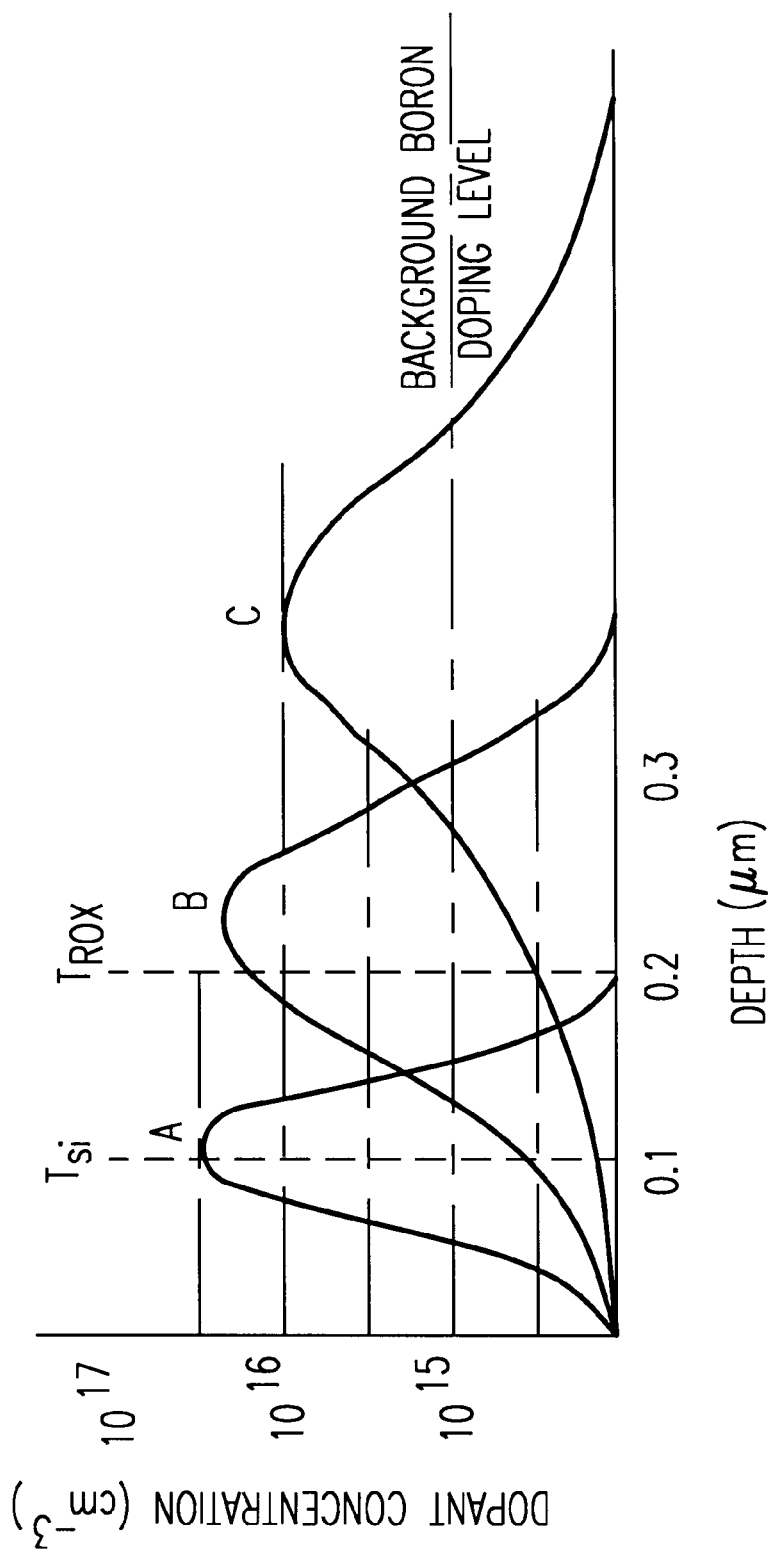
FIG. 7 is a graph showing appropriate depth for an N-well like implant in the ESD arrangement according to the present invention.

FIG. 7 shows appropriate depth for the N-well like implant 36 where the oxide 32 has a thickness of about 0.2 $\mu$m and the silicon in the implant 34 has a thickness of about 0.1 $\mu$m. The implant A, having a depth of about 0.1 $\mu$m, is too shallow, doping the device. The implant C, having a depth of about 0.4 $\mu$m, is too deep, resulting in a high resistance region just below the oxide 32. The implant B, with a depth of about 0.15 to 0.30 $\mu$m, more specifically, about 0.23 $\mu$m, has a suitable depth.

It will be apparent to those skilled in the art and it is contemplated that variations and/or changes in the embodiments illustrated and described herein may be made without departure from the present invention. Accordingly, it is intended that the foregoing description is illustrative only, not limiting, and that the true spirit and scope of the present invention will be determined by the appended claims.

We claim:

1. An ESD protection arrangement for a silicon-on-insulator device having a silicon substrate, comprising:
   means for protecting against negative transients and positive transients, wherein said means for protecting comprises vertical junctions in the silicon substrate of the silicon-on-insulator device.

2. The ESD protection arrangement of claim 1, wherein said junctions of said means for protecting comprise an N-well implant in the silicon substrate.

3. The ESD protection arrangement of claim 2, wherein one of said junctions comprises a junction of said N-well implant with a p$^+$ diffusion implant in said silicon substrate.

4. The ESD protection arrangement of claim 3, wherein another one of said junctions comprises a junction of said N-well implant with an n$^+$ diffusion implant in said silicon substrate.

5. The ESD protection arrangement of claim 4, further comprising an ESD area having an exterior surface, wherein said p$^+$ diffusion implant and said n$^+$ diffusion implant are positioned between said N-well implant and said exterior surface.

6. The ESD protection arrangement of claim 2, wherein one of said junctions comprises a junction of said N-well implant with an n$^+$ diffusion implant in said silicon substrate.

7. The ESD protection arrangement of claim 2, wherein the N-well implant has a concentration of about 1.4 times $10^{16}$/cm$^3$ of phosphorous at a depth of about 0.23 $\mu$m.

8. The ESD protection arrangement of claim 2, wherein the N-well implant is a product of implantation at an energy of about 260 kV and a dose of about 1E12 ions per cm$^2$.

9. The ESD protection arrangement of claim 2, further comprising a lateral insulation layer on the N-well implant, the lateral insulation layer comprising an oxide having a thickness of about 2700 Angstroms.

10. An ESD protection arrangement for a silicon-on-insulator device having a silicon substrate, comprising:
    an arrangement for protecting against negative transients and positive transients, wherein said arrangement for protecting comprises vertical junctions in the silicon substrate of the silicon-on-insulator device.

11. The ESD protection arrangement of claim 10, wherein said junctions of said arrangement for protecting comprise an N-well implant in the silicon substrate.

12. The ESD protection arrangement of claim 11, wherein one of said junctions comprises a junction of said N-well implant with a p$^+$ diffusion implant in said silicon substrate.

13. The ESD protection arrangement of claim 12, wherein another one of said junctions comprises a junction of said N-well implant with an n$^+$ diffusion implant in said silicon substrate.

14. The ESD protection arrangement of claim 13, further comprising an ESD area having an exterior surface, wherein said p$^+$ diffusion implant and said n$^+$ diffusion implant are positioned between N-well implant and said exterior surface.

15. The ESD protection arrangement of claim 11, wherein one of said junctions comprises a junction of said N-well implant with an n$^+$ diffusion implant in said silicon substrate.

16. The ESD protection arrangement of claim 11, wherein the N-well implant has a concentration of about 1.4 times $10^{16}$/cm$^3$ of phosphorous at a depth of about 0.23 $\mu$m.

17. The ESD protection arrangement of claim 11, wherein the N-well implant is a product of implantation at an energy of about 260 kV and a dose of about 1E12 ions per cm$^2$.

18. The ESD protection arrangement of claim 11, further comprising a lateral insulation layer on the N-well implant, the lateral insulation layer comprising an oxide having a thickness of about 2700 Angstroms.

* * * * *